United States Patent
Bryer et al.

(10) Patent No.: US 6,432,214 B2
(45) Date of Patent: Aug. 13, 2002

(54) CLEANING APPARATUS

(75) Inventors: Charles James Bryer; Daniel P. Bexten; Jerry R. Norby, all of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/113,440

(22) Filed: Jul. 10, 1998

(51) Int. Cl.[7] .................................................. B08B 7/04
(52) U.S. Cl. ...................... 134/10; 134/25.1; 134/25.4; 134/25.5; 134/26; 134/29; 134/95.3; 134/153; 134/111; 134/902
(58) Field of Search ............................ 134/10, 26, 25.1, 134/25.4, 25.5, 28, 29, 30, 32, 33, 902, 2, 3, 95.2, 95.1, 95.3, 102.1, 153, 106.4, 109, 111

(56) References Cited

U.S. PATENT DOCUMENTS

| | | |
|---|---|---|
| 193,222 A | 7/1877 | Buell |
| 910,882 A | 1/1909 | Truesdell |
| 1,405,243 A | 1/1922 | Wing |
| 2,721,566 A | 10/1955 | Brucker |
| 3,242,934 A | 3/1966 | Heinicke et al. |
| 3,443,567 A | 5/1969 | Moore |
| 3,526,237 A | 9/1970 | Neill, Jr. |
| 3,608,567 A | 9/1971 | Neill, Jr. |
| 3,727,620 A | 4/1973 | Orr |
| 3,769,992 A | 11/1973 | Wallestad |
| RE28,135 E | 8/1974 | Hull |
| 3,853,622 A | 12/1974 | Rutten |
| 3,990,462 A | 11/1976 | Elftmann et al. |
| 4,077,416 A | 3/1978 | Johnson, Jr. et al. |
| 4,132,567 A | 1/1979 | Blackwood |
| 4,208,760 A | 6/1980 | Dexter et al. |
| 4,370,992 A | 2/1983 | Choudhury et al. |
| 4,456,022 A | 6/1984 | Roberts |

(List continued on next page.)

FOREIGN PATENT DOCUMENTS

| | | |
|---|---|---|
| DE | 3815018 | 12/1988 |
| JP | 12576 | 1/1977 |
| JP | 1111338 | 4/1989 |
| JP | 01199431 | 10/1989 |
| JP | 264661 | 5/1997 |
| JP | 2646611 | 8/1997 |

OTHER PUBLICATIONS

Handbook of Semiconductor Wafer Cleaning Technology, Noyes Publications, pp. 597, 598, 393, 56, 52 and 51. 1993.*
Handbook of Semiconductor Wafer Cleaning Technology, Noyes Publications, pp. 137–141. 1993.*
Brochure—SEMAX ILIOS 5 Cleaner For Carriers and Boxes, SEMAX Prozess Technik GmbH (Germany), 4 pgs. Dec. 1997.
Brochure—DMS Dynamic Micro Sytems "Model 300 Centrifugal Force Cleaner", DMS (Germany), 2 pgs Nov. 1998.
Hattori, T. et al., "Introducing A New PFA Wafer–Carrier Cleaning Technology", Microcontamination, (Dec. 1991), vol. 9, No. 12, pp. 17–21.
Booklet—"Storm—The powerful new concept in box washers", Semitool, 9/95, 26 pages.
Brochure—"Storm—The powerful new concept in box washers", Semitoo, 9/93, 6 pages.

Primary Examiner—Alexander Markoff
(74) Attorney, Agent, or Firm—Lyon & Lyon LLP

(57) ABSTRACT

A machine for cleaning containers has inside and outside arrays of nozzles arranged to spray a cleaning solution onto containers supported on a spinning rotor. Used cleaning solution is diverted to a reclaim tank for reuse, thereby allowing low-cost cleaning with concentrated chemicals, and with the creation of less liquid waste requiring disposal. In a method for removing contaminants from flat media or silicon wafer containers or carriers, a mixture of surfactant and de-ionized water is sprayed onto containers on a spinning rotor. The used cleaning solution is collected, filtered and reused.

18 Claims, 10 Drawing Sheets

U.S. PATENT DOCUMENTS

| | | |
|---|---|---|
| 4,694,527 A | 9/1987 | Yoshizawa |
| 4,745,422 A | 5/1988 | Matsuoka et al. |
| 4,750,505 A | 6/1988 | Inuta et al. |
| 4,781,417 A | 11/1988 | Nishizawa et al. |
| 4,788,994 A | 12/1988 | Shinbara |
| 4,817,652 A | 4/1989 | Liu et al. |
| 4,903,717 A | 2/1990 | Sumnitsch |
| 4,941,489 A | 7/1990 | Kamimura et al. |
| 4,982,215 A | 1/1991 | Matsuoka |
| 4,982,753 A | 1/1991 | Grebinski, Jr. et al. |
| 5,000,208 A | 3/1991 | Ludwig et al. |
| 5,022,419 A | 6/1991 | Thompson et al. |
| 5,027,841 A | 7/1991 | Breunsbach et al. |
| 5,038,809 A | 8/1991 | Rodgers |
| 5,069,236 A | 12/1991 | Pierson |
| 5,224,503 A | 7/1993 | Thompson et al. |
| 5,361,449 A | 11/1994 | Akimoto |
| 5,409,310 A | 4/1995 | Owczarz |
| 5,409,544 A | 4/1995 | Ota et al. |
| 5,466,389 A | 11/1995 | Ilardi et al. |
| 5,487,398 A | 1/1996 | Ohmi et al. |
| 5,562,113 A | 10/1996 | Thompson et al. |
| 5,738,128 A | 4/1998 | Thompson et al. |

\* cited by examiner

CLEANING APPARATUS

The technical field of this invention is cleaning apparatus for rinsing and drying containers and carriers used to hold and process semiconductor wafers, substrates, flat panel displays and other flat media requiring low contamination levels.

BACKGROUND OF THE INVENTION

Flat media, such as silicon or other semiconductor wafers, substrates, photomasks, flat panel displays, data disks, and similar articles require extremely low contamination levels. Even minute contaminants can cause defects. Accordingly, it is necessary to maintain a high level of cleanliness during all or nearly all stages of production of these types of flat media. The flat media described may be referred to below as "wafers", although it will be understood that "wafers" means any form of flat media.

Wafers are typically processed in batches. For example, in manufacturing semiconductor chips, for use in computers, telephones, televisions, and other electronic products, silicon wafers will undergo many batch processing steps, such as oxidation, photolithography, diffusion, chemical vapor deposition, metallization and etching. Batch handling may occur throughout the entire production process, or for one or more processing steps or related handling operations. Batch processing of this type almost always utilizes some type of carrier or container to hold the wafers being processed.

A wafer carrier or container holds a group of wafers. The wafer carriers can be of various designs, and are more specifically referred to as a wafer boat. In many applications, they are made of a suitable polymeric material, e.g., polypropylene or TEFLON® fluoropolymer. The sides and sometimes the bottom of the wafer boat have receiving slots formed to receive and hold the wafers in a spaced array with the faces of the wafers adjacent to one another. Typically, the central axes of the wafers are aligned. The wafers are slid into the carrier or container, such as from the side or above, and are removed by sliding them outwardly. The receiving slots are shallow so that the wafer is engaged only at the peripheral edges and along a thin marginal band extending inwardly from the periphery.

Wafer carriers can also be provided in the form of a protective case or box in which the wafers are held and are sealed against contamination during travel within the processing facility. Wafer carriers of this type are frequently designed to hold a wafer boat having a complementary design. The complementary relationship of the protective wafer carrier box and the wafer carrier boat allow the boat and supported wafers to be fully enclosed and securely held in place during transport. The term "carrier" referred to below means a carrier, a container, with or without a lid, or a wafer boat.

At certain stages in the manufacturing process, the wafer carriers must be cleaned. Cleaning them is difficult because they typically have features which include slots, grooves or apertures, and inside corners. These difficulties are made worse by the extremely low contamination levels which are required for processing the wafers.

Accordingly, cleaning of wafer carriers remains a difficult, time consuming and relatively costly procedure. In addition, the carriers will often become contaminated with photoresist, a viscous sticky material used in manufacturing various semiconductor products. Photoresist can be especially difficult to clean away. Sticky-back labels, fingerprints, dust, metal particles and organic chemicals, may also contaminate the wafer carriers.

Various machines have been made and used for cleaning wafer carriers. In these machines, the carriers are mounted on a rotor and spin within a chamber, while cleaning solutions are sprayed onto the carriers. The spinning movement minimizes process time and also helps in drying the carriers. In certain applications, surfactant has been introduced and mixed with de-ionized water, at a concentration of approximately 1:10,000. Used in this way, the surfactant acts as a wetting agent which helps to remove only loosely adhered particles. The surfactant is used only once and then discarded as waste. While this use of surfactant has improved cleaning performance, it has been largely ineffective in removing contaminants such as photoresist, labels, and fingerprints.

Accordingly, it is an object of the invention to provide an improved machine for cleaning carriers and containers for flat media.

SUMMARY OF THE INVENTION

In a first aspect of the invention, an apparatus for cleaning flat media carriers includes a rotor rotatably mounted within a chamber. Nozzles within the chamber are arranged to spray a mixture of water and a detergent or surfactant on to carriers supported on the rotor. A reclaim tank is connected to the chamber, to collect and recycle the water and surfactant mixture. The mixture has a concentration of surfactant sufficiently high to remove contaminants such as photoresist, labels, and fingerprints.

In a second aspect of the invention, used mixture of water and surfactant is pumped through a filter before it is reused. Filtering the used mixture allows it to be re-used many times, without significantly reducing the cleaning effectiveness of the machine.

In a third aspect of the invention, the water and surfactant mixture is prepared in a mixing tank linked to the reclaim tank and to some of the nozzles. The mixing tank facilitates achieving the desired concentration of surfactant in the surfactant and water solution and provides a reservoir for the solution.

In a fourth aspect of the invention, a diverter valve diverts the run-off from the chamber to the reclaim tank, when the water and surfactant solution is sprayed within the chamber. The diverter valve diverts the run-off from the chamber to a waste drain during the parts of the cleaning cycle when no surfactant is used.

BRIEF DESCRIPTION OF THE DRAWINGS

Other objects and features will become apparent from the following detailed description taken in connection with the accompanying drawings. However, the drawings are provided for purpose of illustration only, and are not intended as a definition of the limits of the invention.

In the drawings, wherein the same reference numbers denote the same elements throughout the several views.

DETAILED DESCRIPTION OF THE DRAWINGS

Figure 1:
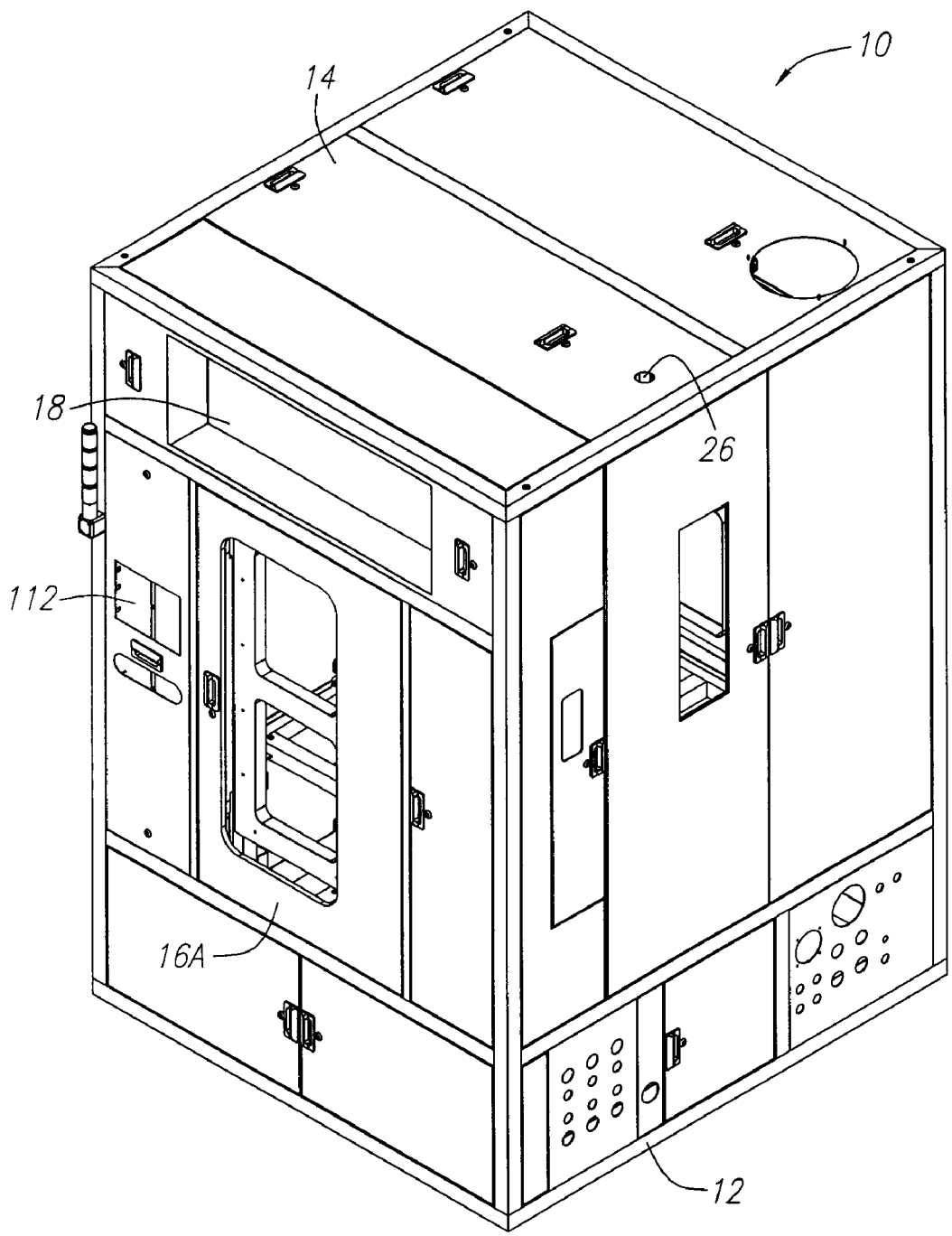
FIG. 1 is a front, top and right side perspective view of the present cleaning apparatus.
Figure 2:
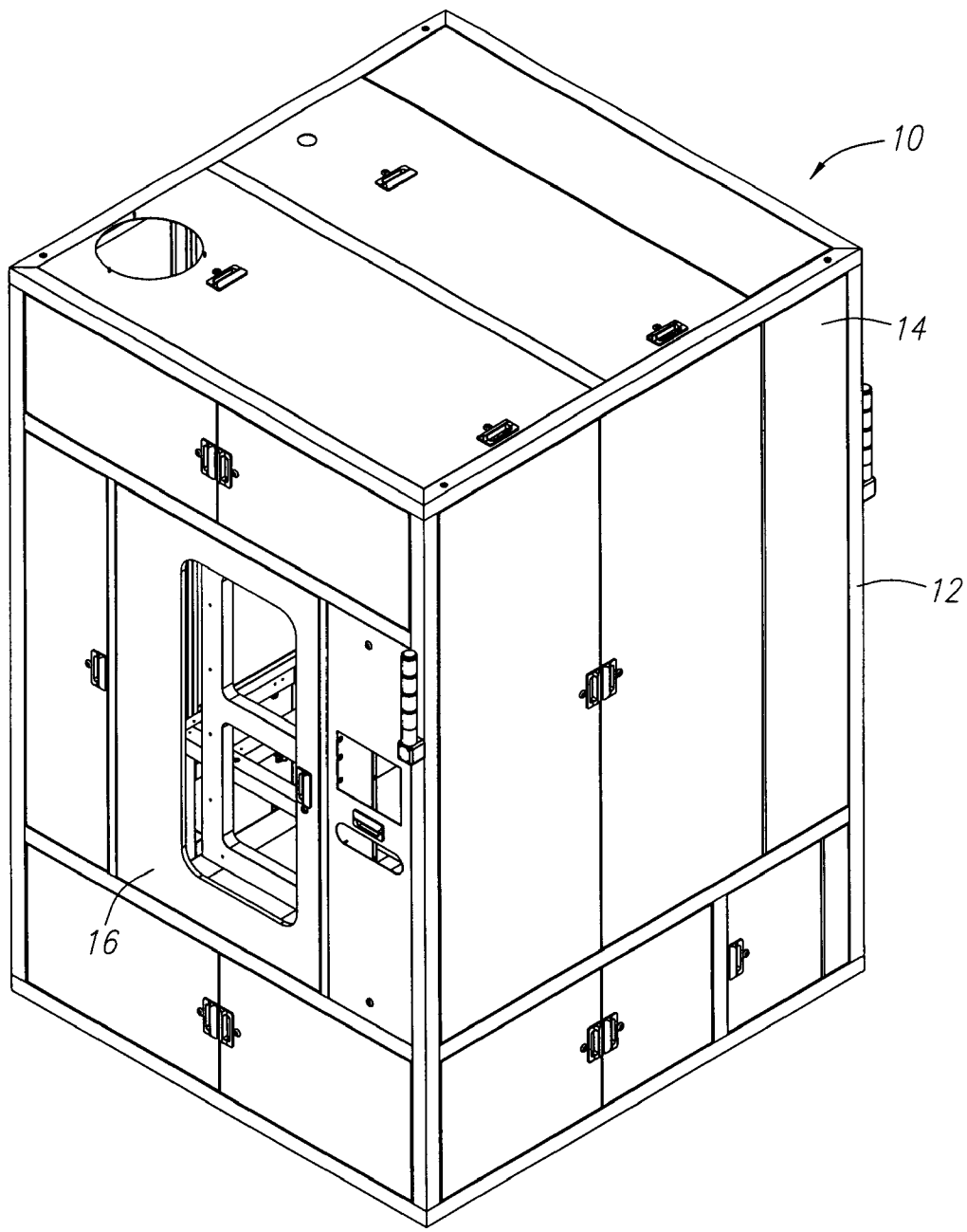
FIG. 2 is a back, top and left side perspective view thereof.

Turning now in detail to the drawings, as shown in FIGS. 1 and 2, the present carrier cleaning machine 10 has a frame 12 and housing panels 14 forming an enclosure. A back door 16 and front door 16A are provided on the front and back surfaces of the machine 10. The machine 10 is generally installed in a clean room, of the type used in manufacturing semiconductors. An air filter enclosure 18 is located above the front door 16A, and contains a filter which filters clean room. An exhaust duct 26 extends out of the top of the machine 10, at the back right corner, and is ordinarily connected to a facility or building exhaust duct.

Figure 3:
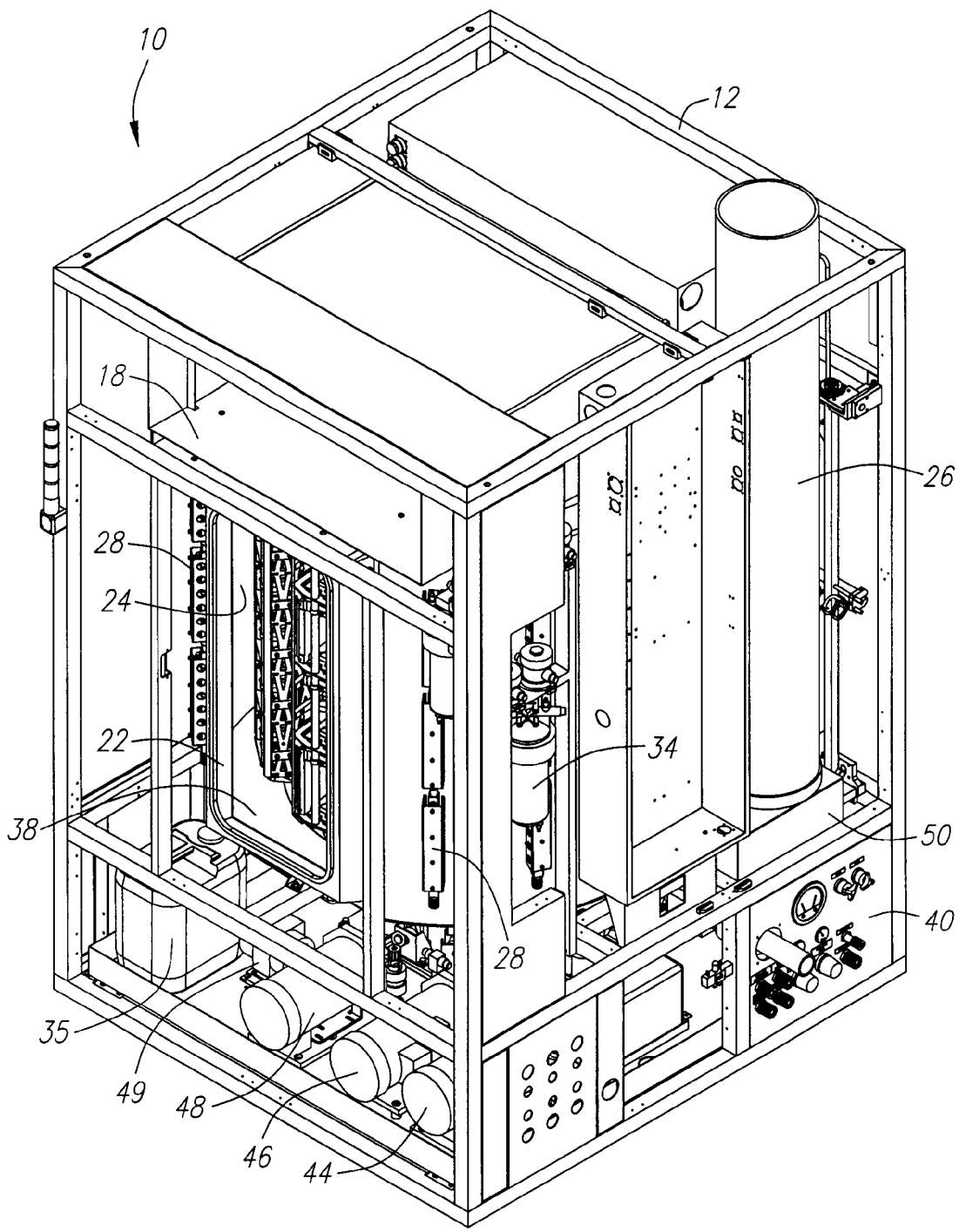
FIG. 3 is a front, top and right side perspective view of the apparatus shown in FIGS. 1 and 2, with the covers removed.
Figure 4:
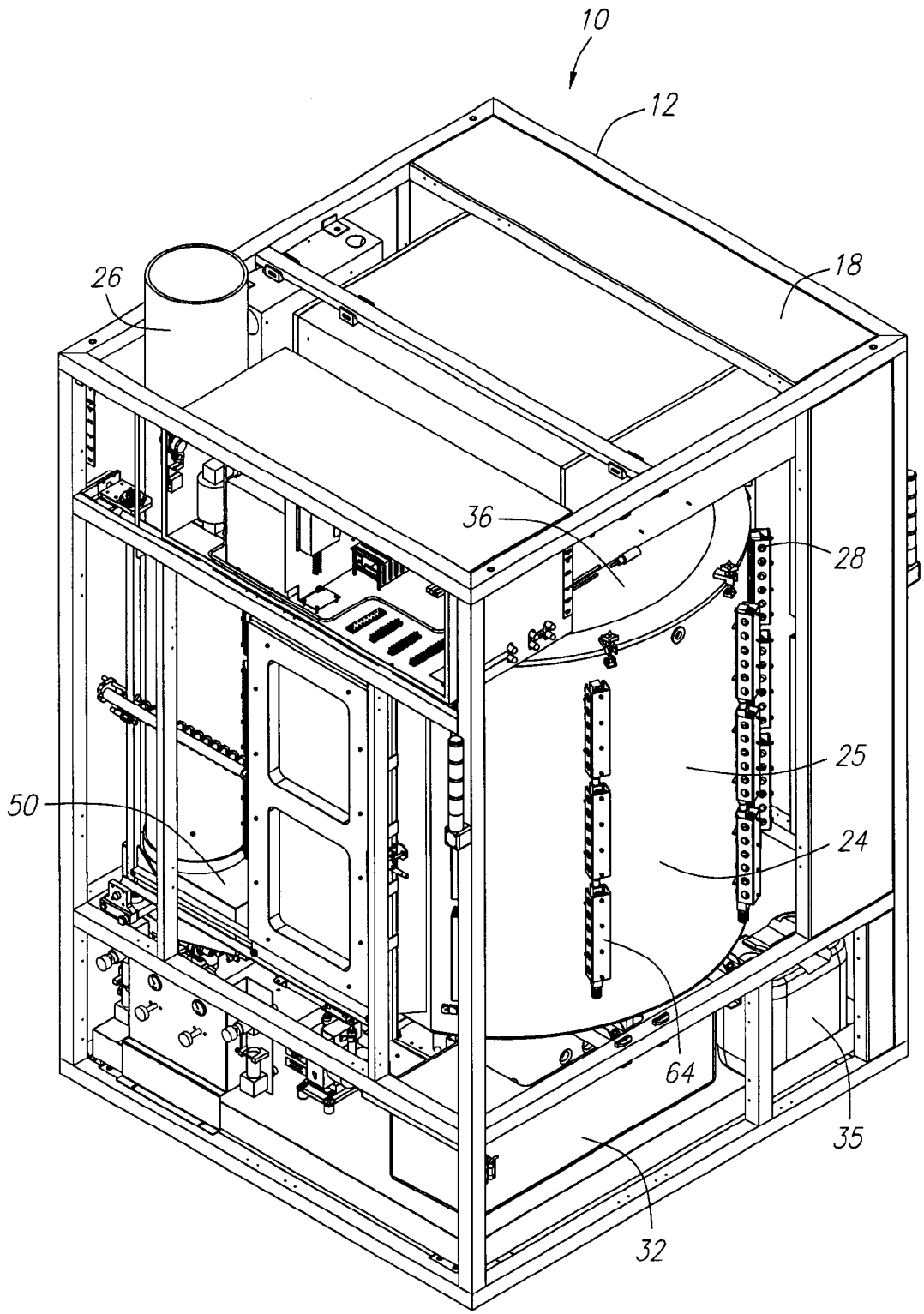
FIG. 4 is a back, top and left side view thereof.
Figure 6:
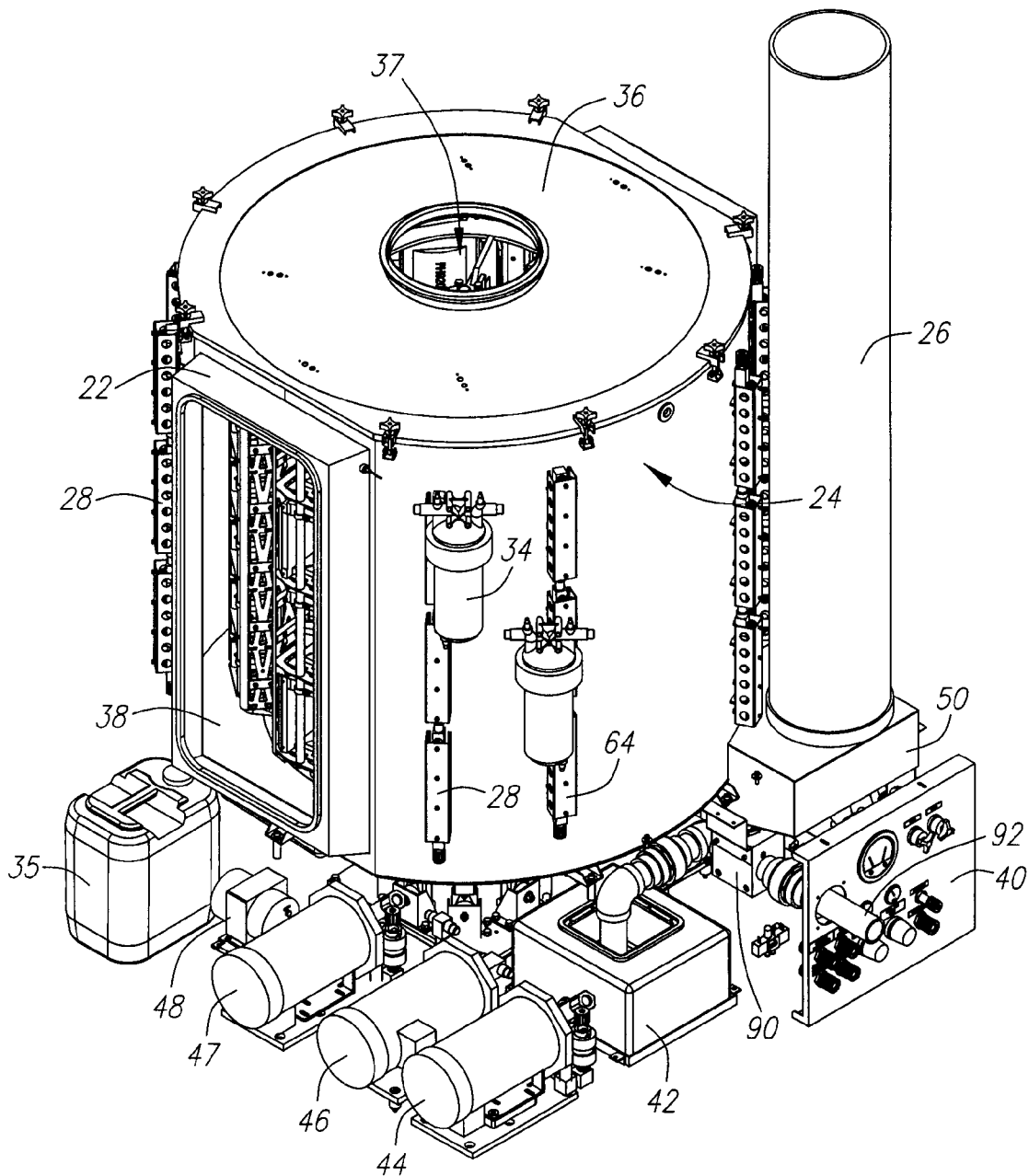
FIG. 6 is a front, top and right side perspective view of certain major components of the apparatus shown in FIGS. 1–5.
Figure 7:
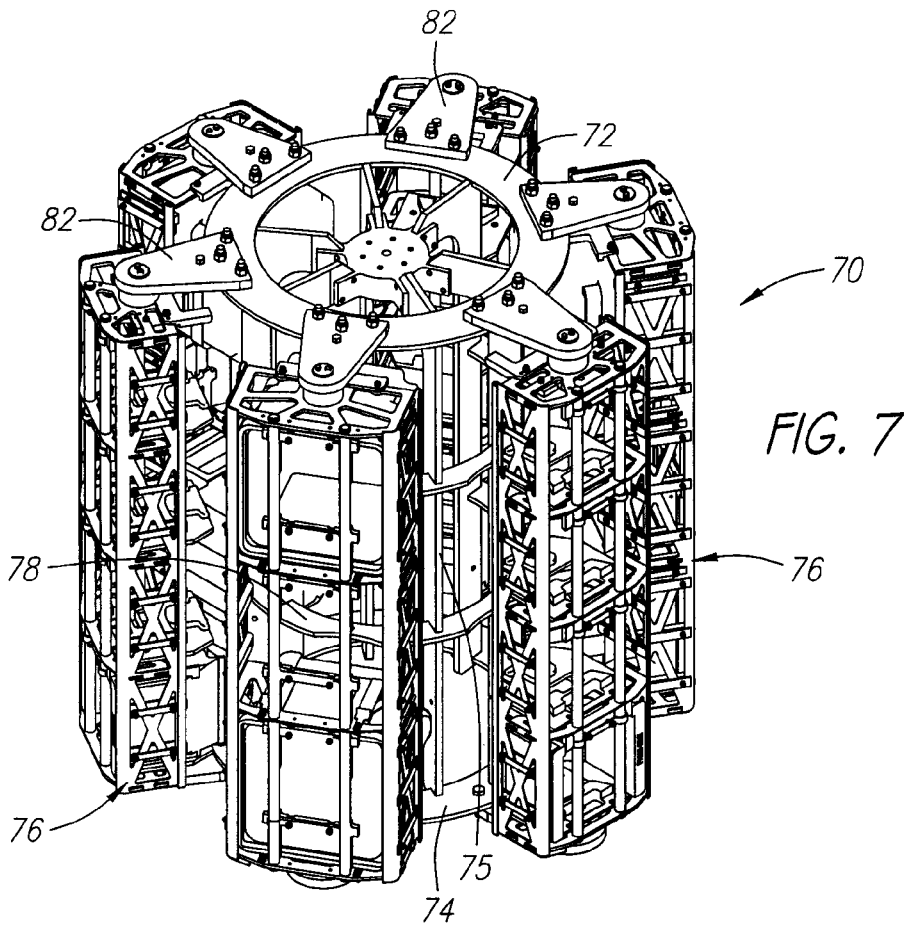
FIG. 7 is a perspective view of the rotor removed from the chamber.
Figure 8:
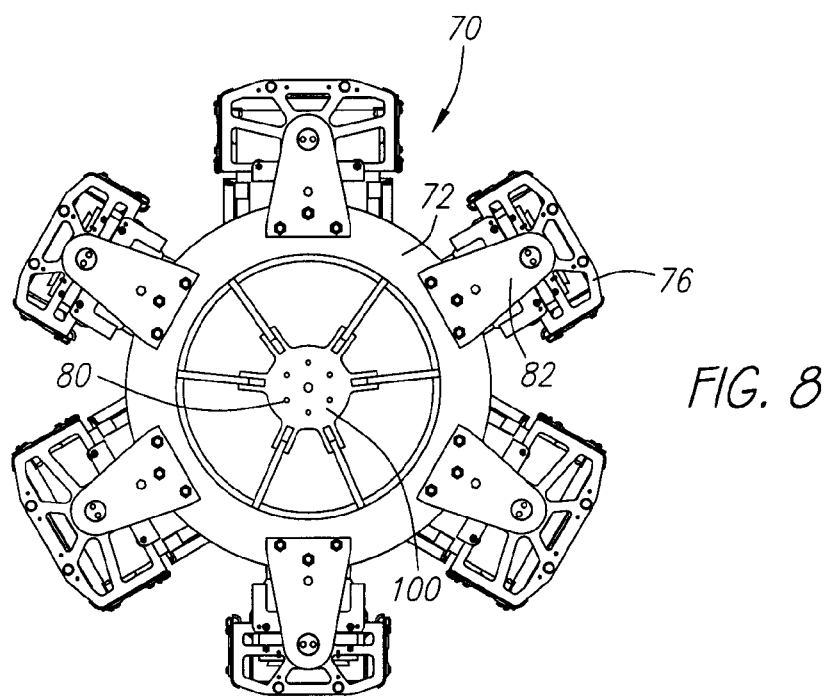
FIG. 8 is a plan view thereof.
Figure 9:
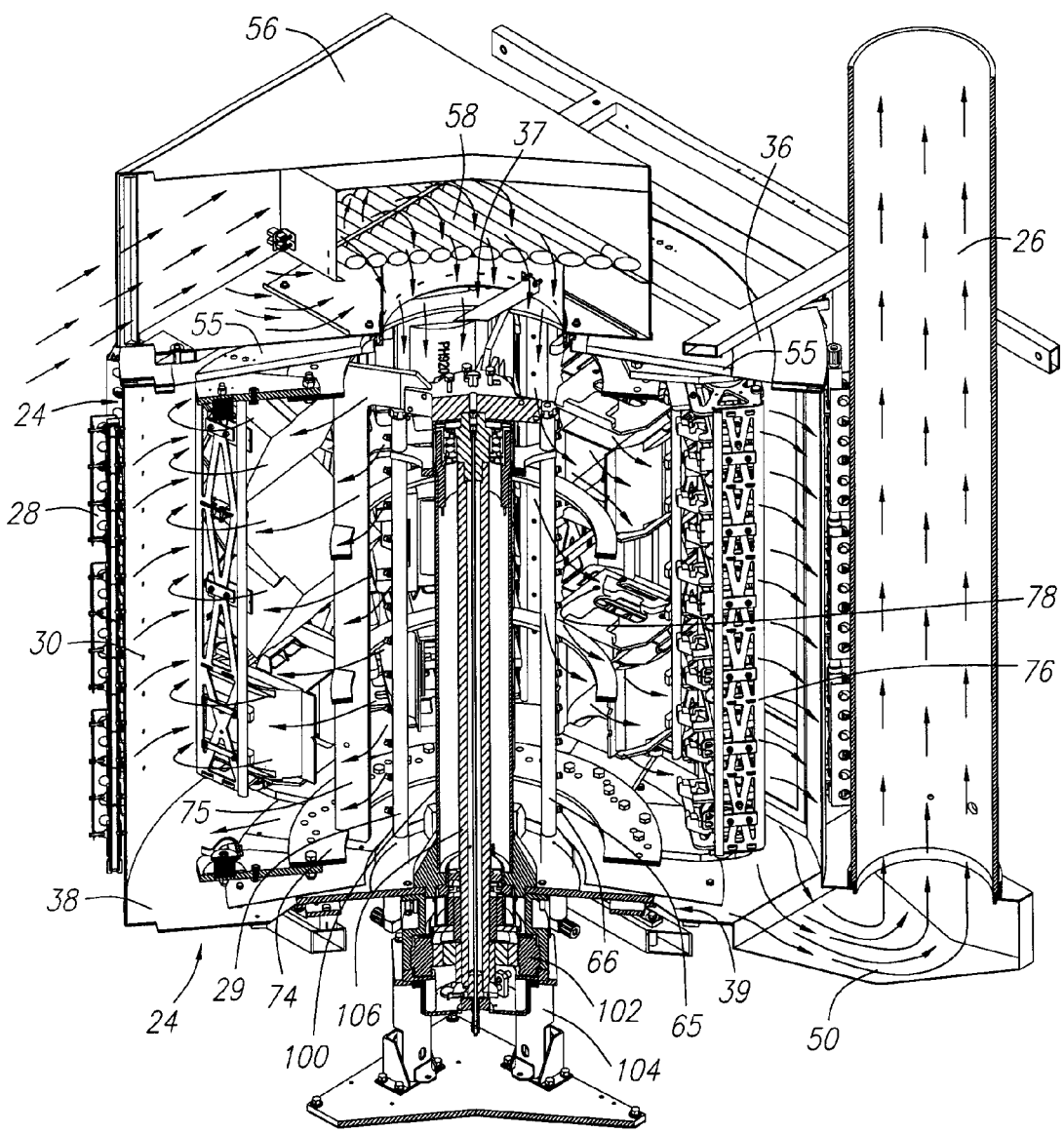
FIG. 9 is a section perspective view illustrating air movement through the apparatus.

Referring to FIGS. 3, 6 and 9, a cylindrical chamber 24 is supported within the frame 12. The chamber 24 has cylindrical side walls 25 and is closed off on the top and bottom by a top plate 36 and a bottom plate 38. The top plate 36, has a central opening 37 so that air passing through the filter box 18 can flow into and downwardly through the chamber 24. An exhaust plenum 50 at the lower back and right side of the chamber 24 connects to the exhaust duct 26, for moving air out of the chamber 24. A drain opening 39 at a low point of the chamber 24, in the exhaust plenum 50 drains fluids out of the chamber.

Figure 5:
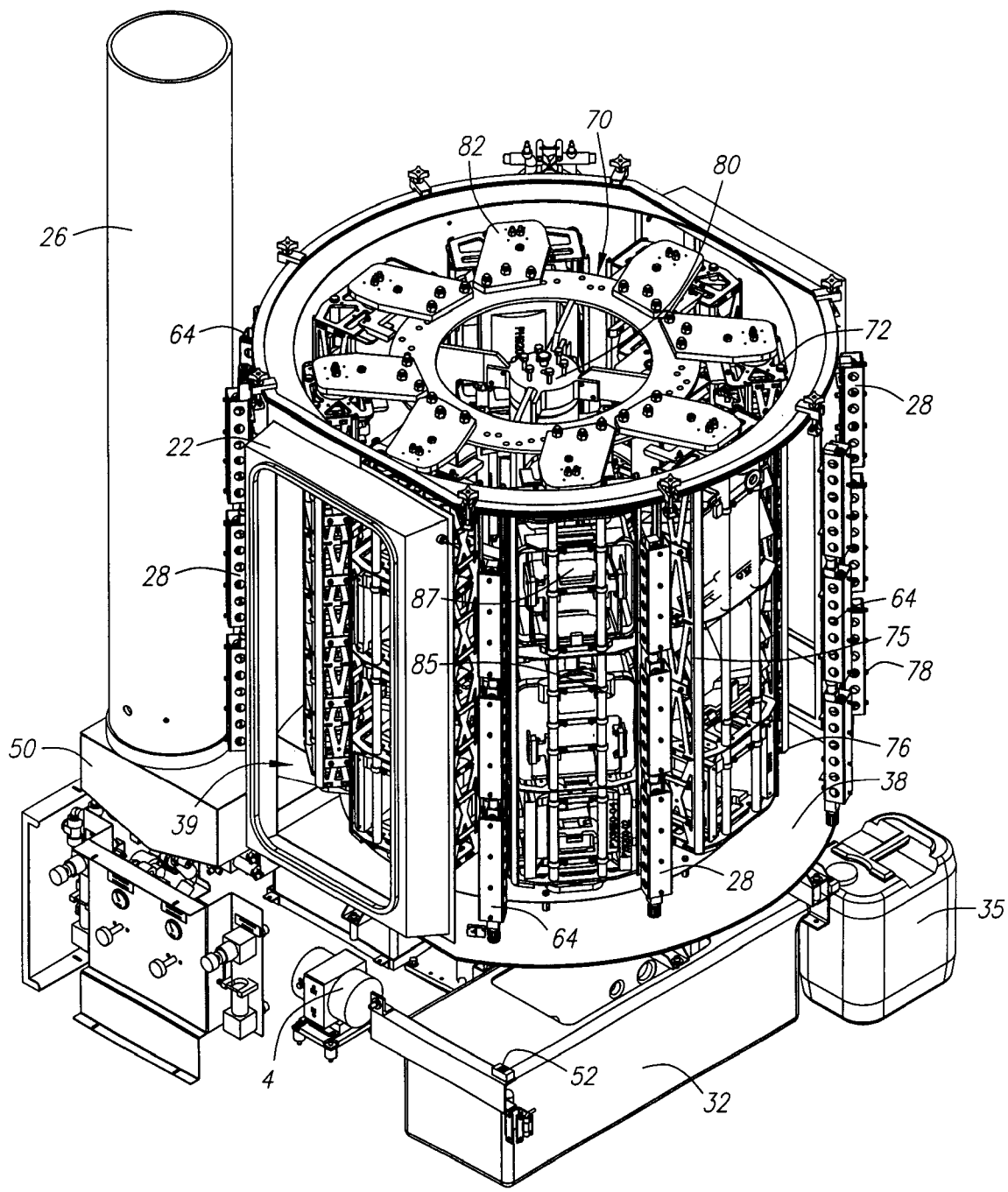
FIG. 5 is a back, top and left side perspective view with various components removed for purposes of illustration.
Figure 10:
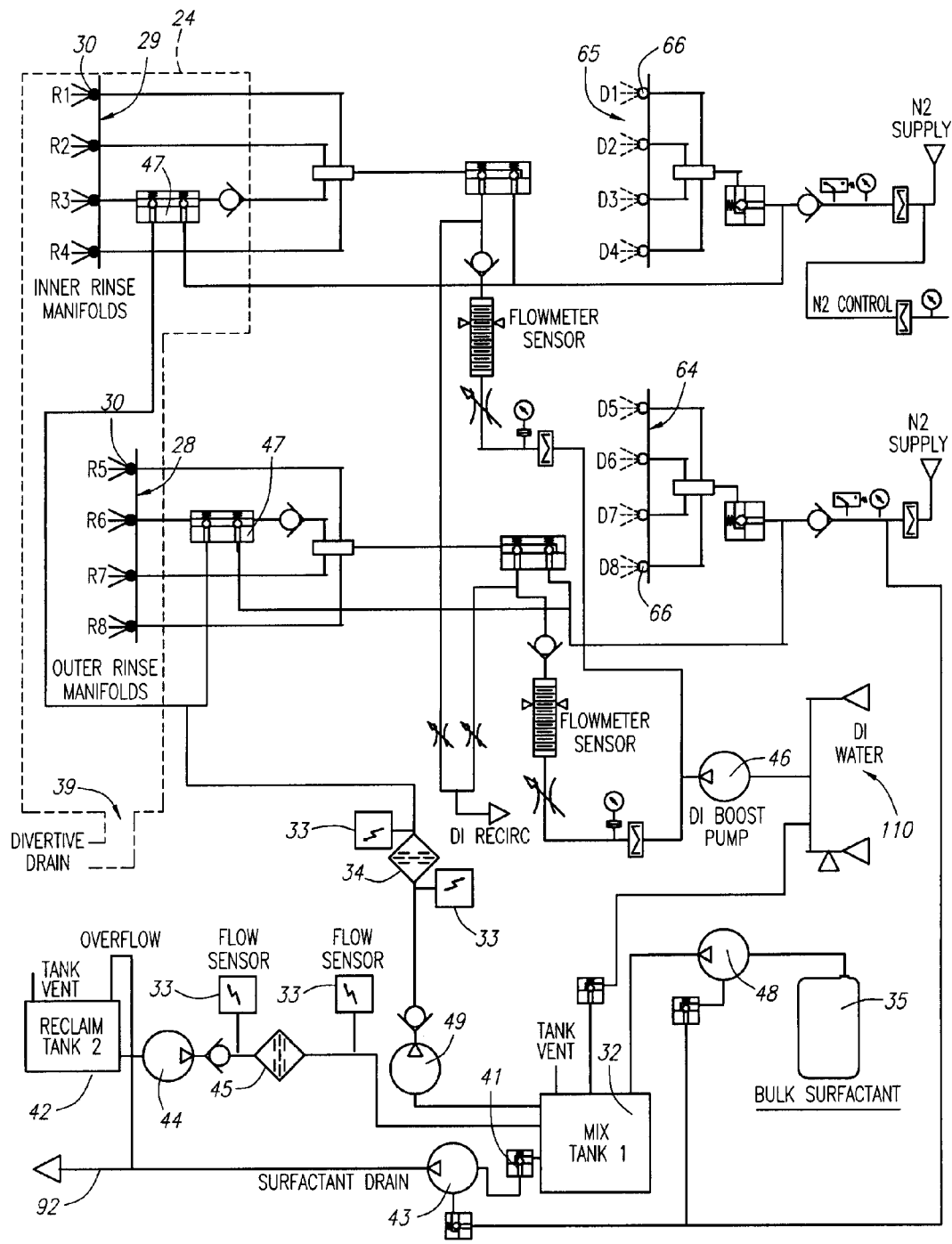
FIG. 10 is a schematic diagram showing fluid flow and interconnections in the present machine.
Figure 11:
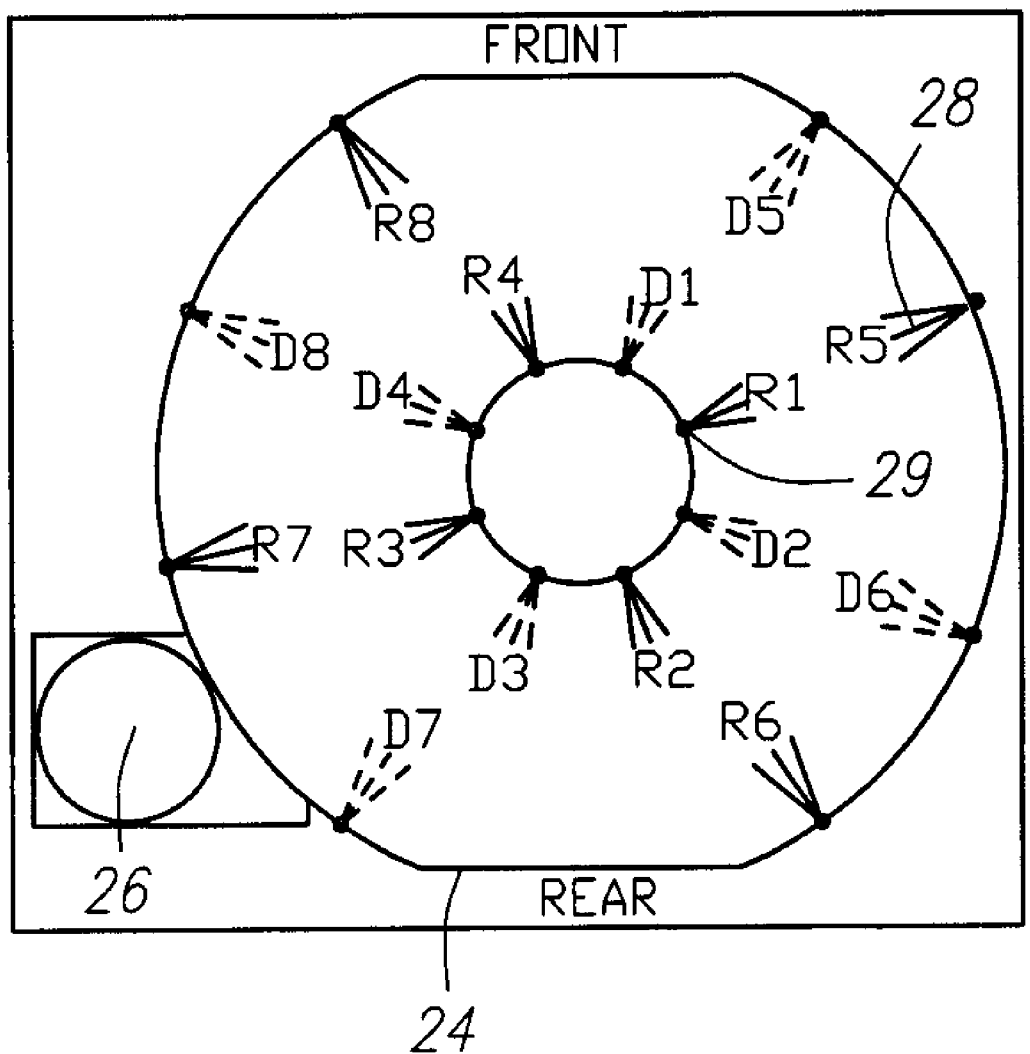
FIG. 11 is a schematically illustrated top view showing orientations of spray nozzles.

Referring to FIGS. 5, 9 and 11, outer rinse manifolds 28, each having e.g., 12 spray nozzles, are positioned around the outside circumference of the chamber 24, on the chamber cylindrical side walls 25. The manifolds 28 may be located on the outside of the cylindrical side walls 25, as shown in FIGS. 4–6 and 10, or may be on the inside surface of the cylindrical side walls 25, SO long as the rinse spray nozzles 30 on the outer rinse manifolds 28 are appropriately positioned to spray the work pieces, i.e., the wafer carriers.

Inner rinse manifolds 29 are positioned near the center of the chamber 24, with each inner rinse manifold having a plurality of rinse spray nozzles 30 oriented to spray outwardly on to the work pieces (i.e., wafer carriers, containers or lids).

Similarly, outer dry manifolds 64, each having a plurality of dry spray nozzles 66, are spaced apart around the circumference of the chamber 24, on the chamber cylindrical side walls 25. Inner dry manifolds 65, each also having a plurality of dry spray nozzles 66 are positioned near the center of the chamber 24. The preferred orientation of the dry manifolds (D1–D8) and the rinse manifolds (R1–R8) is shown in FIG. 11.

Referring momentarily to FIG. 10, the dry manifolds are connected via fluid lines to a supply of pressurized gas, such as air or nitrogen. The rinse manifolds 29 are connected via fluid lines to a source of de-ionized (DI) water, and to a mix tank 32. Pressurized gas lines are also connected to the spray manifolds, for purging. A boost pump 46 increases the water pressure of the DI-water from the external source 110 to the rinse manifolds 28 and 29.

Referring to FIGS. 3–6, and 10, the mix tank 32 is suspended on load cells 52 supported on the frame 12. A surfactant tank or bottle 35 is connected to the mix tank 32 via a fluid line and a surfactant delivery pump 49. An external source of de-ionized water 110 is connected to the mix tank 32 via a fluid line. The mix tank 32 is also connected via fluid lines, and via a mix tank pump 48 and control valves 47 to a outer rinse manifold 28 (manifold R6 in FIGS. 10 and 11) and to an inner rinse manifold 29 (manifold R3 in FIGS. 10 and 11). A filter 34 is placed in the fluid line from the mix tank 32, before the manifolds 28 and 29. Pump 48 pumps surfactant from the tank or bottle 35 into the mix tank 32. Pump 49 pumps the DI-water/surfactant solution from the mix tank 32, to the rinse manifolds 28 and 30.

The drain opening 39 at the bottom of the chamber 24 leads to a diverter 90 which connects the drain opening 39 to either a reclaim tank 42, or to a facility waste drain 92. Referring to FIG. 10, the reclaim tank 42 is connected to the mix tank 32 via a fluid line having a reclaim pump 44 and a reclaim filter 45. Flow sensors 33 are provided around the filters 34 and 45, to monitor filter flow and signal for filter replacement when needed.

Referring momentarily to FIG. 9, air heaters 58 are provided within an air inlet plenum 56 behind the air filter box 18 and over the center or inlet opening 37 leading into the top of the chamber 24. Blanket heaters 55 are also provided around the top of the chamber 24. A computer/controller 112 is linked to and controls the various pumps, valves and heaters, and is linked to and receives input from the flow sensors and load cells, described above.

Referring to FIGS. 6–9, a rotor 70 is rotatably supported within the chamber 24 on a base 104. The rotor has a top ring 72 and a bottom ring 74 connected by a frame work 75. Ladders 76 are pivotally supported on upper and lower ladder supports 82 extending radially outwardly from the top ring 72 and the bottom ring 74. Each ladder 76 has a plurality of compartments 78 for holding containers or carriers 85, or container lids 87, as shown in FIG. 9. The configuration of the ladders 76 and the design of the compartments 78 on the ladders 76 are adapted for the specific sizes and types of carriers, containers, and lids to be cleaned. The entire rotor 70 is rotatably supported on a center column 100 and a rotor axle 106 within the center column 100. A rotor drive motor 102 spins the rotor 70. The detailed design features of the rotor 70, center column 100 and rotor axle 106 are well known, and are described in U.S. Pat. No. 5,224,503, incorporated herein by reference.

A facilities panel 40 on the machine 10, as shown in FIG. 6, has connections to input de-ionized water and gas, e.g., nitrogen or air into the machine 10, and a connection for the waste drain 92, as well as gauges and valves for measuring and controlling fluid/gas flow.

In use, the machine 10 is typically installed in a silicon wafer or other flat media manufacturing facility. As the wafers are moved through various processing steps, the carriers 85 become contaminated, and must be cleaned before wafers are replaced into the carriers. The door 16 or 16A of the machine 10 is opened. The rotor 70 is turned or indexed until a ladder 76 is aligned with the door. The ladder 76 is then turned 180° so that the empty compartments 78 can be accessed through the door 16. The carriers 85 are loaded into the compartments 78 and the ladder is turned back to its original position, so that the compartments 78 are facing to the inside of the chamber 24. The ladders 76 are preferably provided with a latch or detent to lock the ladders into the closed or operating position, with the compartments 78 facing the inside of the chamber 24. The next ladder 76 is then brought into alignment with the door, for loading, by turning the rotor 70 (by hand or via control of the rotor drive motor 102). Loading continues until all of the ladders 76 are filled.

The surfactant tank 35 is supplied with a detergent or surfactant, for example, Valtron DP 94001 (a high pH alkaline detergent) a preferred surfactant for removing photoresist. The term "surfactant" as used in this application means a surfactant or a detergent. The controller 112, via appropriate control of valves and pumps, delivers DI-water and surfactant into the mix tank 32, to make a desired surfactant solution in the mix tank 32. Preferably, the solution is 4–15% surfactant, with the balance being DI-water, and more preferably the solution is 7–13% surfactant, with the balance being DI-water. The load cells 52 supporting the mix tank 32 provide the weight of the load tank 32 and its contents to the controller 112. Accordingly, the controller 112 can create a surfactant solution of the desired surfactant concentration by monitoring the output of the load cell 52, as the tank 32 is incrementally filled step-wise with water and surfactant. The controller 112 controls the rotor drive motor 102, causing the rotor 70 to spin in a first direction, at a low speed, e.g., 1–50 rpm. Via control of the mix tank pump 49 and valves 47, the DI-water/surfactant solution is sprayed onto the carriers 85 on the spinning rotor. The surfactant solution is preferably applied from only two manifolds, inner rinse manifold R3, and outer rinse manifold R6 (instead of from all 8 manifolds using conventional techniques) in order to allow more soak time.

After a sufficient duration e.g., 3–10 minutes, the rotor 70 reverses direction while the surfactant solution spraying continues, for improved spray coverage. The inner rinse manifolds 29, located inside of the rotor 70, spray radially outwardly from the center of the chamber 24. The outer rinse manifolds 28, located around the chamber cylindrical side walls 25 spray radially inwardly toward the chamber center. This dual spray action, combined with bi-directional rotation of the rotor 70, provides virtually complete coverage of all surfaces of the containers 85.

As the surfactant solution runs down within the chamber 24 and out the drain opening 39, the diverter 90 is switched or positioned to channel the surfactant solution into the reclaim tank 42. When the fluid level in the reclaim tank 42 is sufficiently high, the reclaim pump 44 switches on, pumping the reclaimed surfactant solution through the reclaim filter 45 and into the mix tank 32. Consequently, the surfactant solution made in the mix tank 32 (unused surfactant and DI-water) is supplemented with the reclaimed and filtered surfactant solution. After completion of application of the surfactant solution, the manifolds R3 and R6 are purged by gas or nitrogen flowing through check valves and the control valves 47, as shown in FIG. 10.

As the machine 10 begins the rinse cycle, the diverter 90 switches position, to connect the drain opening 39 to the facility waste drain 92. DI-water is sprayed onto the carriers 85 from all of the rinse manifolds (R1–R8), with the rotor 70 spinning in a first direction, and then reversing and spinning in the opposite direction, e.g., at from 1–50 rpm, preferably about 6 rpm. The heaters 58 are then turned on, and the rotor accelerated up to e.g., 300 rpm, so that water droplets on the containers 85 are centrifugally flung off of the containers, and the containers are dried. The blanket heaters 55 are located on the outside of the top of the chamber 24 and are on continuously, for warming the top of the chamber. The DI rinse water goes out the waste drain 92.

While the machine 10 is useful for cleaning various contaminants, it is especially useful for removing photoresist. Due to its adhesive characteristics, photoresist has been difficult to remove. While it can be removed with various solvents, use of solvents is highly disadvantageous, due to the risk of explosion or fire resulting from volatile solvent vapors. In addition, solvents can also be toxic and harmful to people and the environment, therefore requiring special containers, shipping, storage, collection and disposal procedures, all of which can be costly and time-consuming. The specific cleaning parameters, such as duration of surfactant, rinse water, and air/gas spray, rotation speeds and sequences, heater operation, etc., will, of course, be varied somewhat to achieve optimum results, with different containers and contaminants, as is well known in this technology.

Surfactants, on the other hand, are not flammable or explosive, and do not have the same environmental disadvantages associated with solvents. On the other hand, surfactants can be very expensive, e.g., $40/gallon. Automatic cleaning of containers (in a large machine) consumes about 16 gallons of DI-water per minute. Using a 10% surfactant solution, a 12 minute photoresist removal step would use about 6 gallons of surfactant, costing $240, making automatic large-scale cleaning of containers extremely expensive or even prohibitive. However, in the present machine 10, the surfactant solution is reclaimed, filtered and reused over and over again. Consequently, for the cost of e.g., 6 gallons of surfactant, many more containers can be cleaned.

Over time, and with repeated use, the cleaning efficiency of the surfactant degrades. Consequently, periodically, (e.g, every month) the surfactant solution is preferably removed from the machine 10 and replaced with new surfactant. Referring to FIG. 10, the entire contents of the reclaim tank 42 are pumped into the mix tank 32. The mix tank drain valve 41 is opened and the drain pump 43 turned on, so that the entire contents of the mix tank 32 are pumped out to the waste drain 92. The machine 10 is then prepared to make a new and entirely unused, surfactant solution, as described above. The filters 34 and 45 may be replaced more frequently, as needed.

The machine 10, by virtue of its recovery or reclaim system, enables use of highly concentrated cleaning solutions, such as surfactants, detergents, and ozonated DI-water, for cleaning containers. Solvents, although not ordinarily preferred, could also be used and reclaimed. The reclaim or recovery system allows repeated processing using the same chemical over and over again, thus eliminating the large expense of one-time use. In addition, the reclaim system is environmentally friendly as it avoids releasing large amounts of chemicals into the waste drain. Moreover, as the machine 10 allows the use of chemicals in a concentrated form, more difficult forms of contaminants, such as photoresist, sodium, sticker residues, metals, etc., can be effectively cleaned. Thus, the present machine 10 offers improved cleaning at reduced costs, and in a more environmentally safe way.

Thus, a novel cleaning machine and method has been shown and described. Various changes can, of course, be made without departing from the spirit and scope of the invention. The invention, therefore, should not be restricted, except to the following claims and their equivalents.

We claim:

1. A method for cleaning flat media containers comprising the steps of:

loading the containers onto a rotor within a chamber of a cleaning machine, with an open side of the containers facing radially outwardly;

spinning the rotor carrying the containers;

supplying a mixture comprising water and a 4–15% of an alkaline detergent through delivery lines to spray nozzles within the chamber of the cleaning machine;

spraying the mixture towards the rotor and onto and into the containers;

collecting the used mixture at a drain opening in the chamber and recovering at least some of the used mixture by closing a diverter valve to direct the mixture from the drain opening, at least indirectly, back to the delivery lines;

spraying at least some of the recovered mixture of water and detergent, directed to the delivery lines by the diverter valve, towards the rotor and onto and into the containers;

stopping the spraying of the recovered mixture;

purging the delivery lines of the mixture of water and detergent;

supplying rinse water through the delivery lines to the spray nozzles;

spraying the rinse water towards the rotor and onto and into the containers, to rinse the containers; and collecting the used rinse water and draining it out of the machine by opening the diverter valve to direct the used rinse water from the drain opening in the chamber, to a facility waste drain.

2. The method of claim 1 further comprising the step of filtering the collected used mixture before directing it back into the delivery lines.

3. The method of claim 1 further comprising the step of spinning the rotor at a first speed while the recovered mixture is sprayed towards the rotor, and spinning the rotor at a second speed, higher than the first speed, after stopping the spraying of the mixture, to centrifugally remove the mixture from the containers.

4. The method of claim 1 wherein the detergent comprises from 7–13% of the mixture.

5. The method of claim 1 wherein the detergent comprises 10% of the mixture.

6. The method of claim 1 further comprising the step of spraying the container with a dry gas, to dry the container.

7. The method of claim 6 wherein the dry gas comprises nitrogen or compressed air.

8. The method of claim 1 further comprising the step of moving filtered heated clean room air over the containers.

9. The method of claim 1 wherein the water comprises de-ionized water.

10. The method of claim 1 further comprising the step of spinning the rotor at from 1–50 rpm while spraying the recovered mixture toward the rotor.

11. The method of claim 1 further comprising the step of spinning the rotor at from 100–500 rpm, after spraying the rinse water towards the rotor, to centrifugally dry the containers.

12. A method for removing contaminants from container boxes used for holding flat media, comprising the steps of:

loading the boxes onto a rotor within a chamber of a box cleaning machine;

mixing an alkaline detergent and water in a mix tank, to make an unused cleaning solution of 4–15% detergent;

spinning the rotor;

supplying unused cleaning solution from the mix tank through supply lines to nozzles in the chamber and spraying the boxes on the rotor with the unused cleaning solution;

collecting the now used cleaning solution at a drain in the chamber;

reclaiming the collected used cleaning solution by positioning a diverter valve to divert the used cleaning solution from the drain in the chamber to the mix tank, creating a mixture of used and unused cleaning solution in the mix tank;

supplying the mixture of used and unused cleaning solution from the mix tank through the supply lines to the nozzles in the chamber and spraying the boxes on the rotor with the used and unused cleaning solution;

purging the supply lines;

rinsing the boxes by spraying them with rinse water; and positioning the diverter valve to divert the used rinse water out of the machine.

13. An apparatus for cleaning a flat media carrier, comprising:

a rotor within a chamber, with the rotor having a plurality of compartments for holding the carriers;

a motor attached to the rotor for spinning the rotor within the chamber;

an inside array of nozzles and an outside array of nozzles in the chamber, arranged to spray fluid onto a flat media carrier on the rotor;

a mix tank linked to the nozzles by nozzle supply lines;

an alkaline detergent source connected to the mix tank;

a water source connectable to the mix tank and to the nozzles, with the mix tank containing a 4–15% alkaline detergent mixture;

a purge gas source connectable to the nozzle supply lines;

a chamber drain in the chamber; and a diverter valve connected via piping at least indirectly to the chamber drain, to the mix tank, and to a facility waste drain, with the diverter valve movable from a reclaim position, where the reclaim valve connects the chamber drain at least indirectly to the mix tank, to a waste drain position, where the diverter valve connects the chamber drain at least indirectly to the facility waste drain, and closes off the connection from the chamber drain to the mix tank.

14. The apparatus of claim 13 further comprising a reclaim tank connected to the diverter valve and to the mix tank.

15. The apparatus of claim 13 further comprising a plurality of inside arrays of nozzles and a plurality of outside arrays of nozzles, and with the mix tank linked via the supply lines to only one inside and one outside array of nozzles.

16. The apparatus of claim 13 further comprising a housing around the chamber, and with the mix tank supported on at least one load cell on the housing.

17. The apparatus of claim 13 further comprising a filter between the mix tank and the nozzles.

18. The apparatus of claim 13 further comprising a plurality of ladders on the rotor, with each ladder having multiple positions for holding a flat media container.

* * * * *